(12) United States Patent
Gu et al.

(10) Patent No.: US 12,219,042 B2
(45) Date of Patent: Feb. 4, 2025

(54) SIGNAL SAMPLING METHOD AND APPARATUS, AND OPTICAL RECEIVER

(71) Applicant: ZTE CORPORATION, Guangdong (CN)

(72) Inventors: Guohua Gu, Guangdong (CN); Yangzhong Yao, Guangdong (CN); Nanshan Cao, Guangdong (CN); Chungui Tao, Guangdong (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 408 days.

(21) Appl. No.: 17/642,949

(22) PCT Filed: Sep. 23, 2020

(86) PCT No.: PCT/CN2020/116969
§ 371 (c)(1),
(2) Date: Mar. 14, 2022

(87) PCT Pub. No.: WO2021/063219
PCT Pub. Date: Apr. 8, 2021

(65) Prior Publication Data
US 2022/0407678 A1    Dec. 22, 2022

(30) Foreign Application Priority Data
Sep. 30, 2019    (CN) .......................... 201910944543.1

(51) Int. Cl.
*H04L 7/04*    (2006.01)
*H03M 1/06*    (2006.01)
(Continued)

(52) U.S. Cl.
CPC .......... *H04L 7/042* (2013.01); *H03M 1/0617* (2013.01); *H03M 1/1245* (2013.01); *H04L 7/0029* (2013.01); *H04L 7/027* (2013.01)

(58) Field of Classification Search
CPC ....... H04L 7/0029; H04L 7/027; H04L 7/042; H03M 1/0617
(Continued)

(56) References Cited

U.S. PATENT DOCUMENTS 10,153,844 B2    12/2018    Liu et al.
10,277,718 B1    4/2019    Bellorado et al.
(Continued)

FOREIGN PATENT DOCUMENTS

CN    1447556 A    10/2003
CN    103973400 A    8/2014
(Continued)

OTHER PUBLICATIONS

Andronico et al.: A Feed-Forward Technique for Initial Reference Parameter Estimation in Burst Mode, 13 pages (Year: 1998).*
(Continued)

*Primary Examiner* — Christopher M Crutchfield
*Assistant Examiner* — Jean F Voltaire
(74) *Attorney, Agent, or Firm* — CANTOR COLBURN LLP

(57) ABSTRACT

The present disclosure provides a signal sampling method and apparatus, and an optical receiver. The method includes sampling a burst signal that is received according to a first sampling frequency to obtain a first sampling signal; sampling a preamble signal in the first sampling signal according to a second sampling frequency to obtain a second sampling signal; determining a phase difference between the burst signal and a local sampling clock corresponding to the first sampling frequency according to the second sampling signal; and interpolating the first sampling signal according to the phase difference to obtain a target sampling signal.

10 Claims, 4 Drawing Sheets

(51) Int. Cl.
*H03M 1/12* (2006.01)
*H04L 7/00* (2006.01)
*H04L 7/027* (2006.01)

(58) Field of Classification Search
USPC .......................................................... 370/307
See application file for complete search history.

(56) References Cited

U.S. PATENT DOCUMENTS

| | | |
|---|---|---|
| 2003/0137765 A1 | 7/2003 | Yamazaki et al. |
| 2008/0124092 A1 | 5/2008 | Dvir et al. |
| 2008/0212708 A1 | 9/2008 | Koslov |
| 2014/0211779 A1* | 7/2014 | Caire ................ H04W 56/0015 370/350 |
| 2016/0226654 A1* | 8/2016 | Sinibaldi ............. H04L 27/2665 |
| 2016/0262138 A1* | 9/2016 | Sundberg .................. H04L 5/14 |
| 2018/0287706 A1 | 10/2018 | Liu et al. |

FOREIGN PATENT DOCUMENTS

| | | |
|---|---|---|
| CN | 105245303 A | 1/2016 |
| CN | 106572041 A | 4/2017 |
| CN | 109379314 A | 2/2019 |
| CN | 110198567 A | 9/2019 |
| EP | 0777211 A2 | 6/1997 |
| EP | 1126617 A2 | 8/2001 |
| JP | 2001268041 A | 9/2001 |
| JP | 2003281831 A | 10/2003 |
| KR | 100820315 B1 | 4/2008 |
| WO | 2005086444 A1 | 9/2005 |

OTHER PUBLICATIONS

Andronico (A Feed-Forward Technique for Initial Reference Parameter Estimation in Burst PSK Demodulation (Year: 1998).*

Maurizio Andronico, A Feed-Forward Technique for Initial Reference Parameter Estimation in Burst Mode PSK Demodulation (1), vol. 9, No. Nov. 6, 1998.

ZTE Corporation, Extended European Search Report, EP 20872563.0, Jun. 13, 2022, 9 pgs.

Andronico M. et al., "A Feed-Forward Technique for Initial Reference Parameter Estimation in Burst Mode Psk Demodulation", European Transactions On Telecommunications, Wiley & Sons, Chichester, GB, vol. 9, No. 6, Nov. 1, 1998, 13 pgs.

ZTE Corporation, International Search Report, PCT/CN2020/116969, Nov. 5, 2020, 5 pgs.

Martin Oerder et al., "Digital Filter and Square Timing Recovery," IEEE Transactions on Communications, vol. 36, No. 5, May 1988, 9 pgs.

* cited by examiner

SIGNAL SAMPLING METHOD AND APPARATUS, AND OPTICAL RECEIVER

CROSS REFERENCE TO RELATED APPLICATIONS

The present disclosure is a United States National Stage Application filed under 35 U.S.C. § 371 of PCT Patent Application Serial No. PCT/CN2020/116969, filed Sep. 23, 2020, which claims priority to Chinese Patent Application No. 201910944543.1 filed with the National Intellectual Property Administration, PRC on Sep. 30, 2019, each of which is incorporated by reference herein in its entirety.

TECHNICAL FIELD

The present disclosure relates to the field of communication technology, for example, to a signal sampling method and apparatus, and an optical receiver.

BACKGROUND

With the development of high-speed transmission of data information services such as cloud computing, Internet of Things, the 5$^{th}$ Generation mobile communication technology (5G) or possible future 6$^{th}$ Generation mobile communication technology (6G), optical access networks have to meet new challenges in terms of bandwidth service support capability and transmission performance. The application of high-speed optical transmission network mainly including a passive optical network (PON) is also increasing rapidly. Therefore, the high-speed optical transmission network PON with above 50 GHz or even above 100 GHz is a necessary choice, the demand therefor is very urgent and the requirement on the transmission performance thereof is also higher.

In a time-division multiplexing (TDM)-based PON system, a burst PON technology allocates corresponding transmission time slots for each optical network unit (ONU), and receives optical burst packets generated by different ONUs through an optical receiver on an optical line terminal (OLT), which greatly increases the number of users, adapts to characteristics of burst traffic services in the access network, provides high bandwidth while improving the flexibility of the entire network, and realizes service integration and resource sharing.

An uplink PON transmission system is a burst transmission system with multiple ONUs. The data of different ONUs is sent to the OLT in the form of burst packets. Burst packets from each ONU to OLT in a burst mode may be considered to be instantaneously sent and arrive randomly, which are out of sync with the clock phase of the OLT side and has phase differences with the OLT side. In addition, in the high-speed PON system in the burst mode, distances of the optical transmission links through which the burst packet signals are sent by the different ONUs to the OLT are different, and the link damage to the burst packet signals is also different, so that the delay of each burst packet transmitting to the OLT side is different. Then, when an analog-to-digital converter (ADC) in the receiver on the OLT side performs sampling according to the local clock, the sampling phase may deviate due to that the phase of the burst packet signal when the burst packet arrives is inconsistent with the phase of the local sampling clock on the OLT side, so that the sampling is not performed at the optimal position of the symbol, thereby reducing signal energy of the sampled data and resulting in decrease of a signal-to-noise ratio and increase of bit errors.

SUMMARY

The present disclosure provides a signal sampling method and apparatus, and an optical receiver, so as to at least solve a problem of decrease of a signal-to-noise ratio and increase of bit errors caused by sampling phase deviation in the related technology.

A signal sampling method is provided, including: sampling a burst signal that is received according to a first sampling frequency to obtain a first sampling signal; sampling a preamble signal in the first sampling signal according to a second sampling frequency to obtain a second sampling signal; determining a phase difference between the burst signal and a local sampling clock corresponding to the first sampling frequency according to the second sampling signal; and interpolating the first sampling signal according to the phase difference to obtain a target sampling signal.

A signal sampling apparatus is further provided, including: a first sampler, configured to sample a burst signal that is received according to a first sampling frequency to obtain a first sampling signal; a second sampler, configured to a preamble signal in the first sampling signal according to a second sampling frequency to obtain a second sampling signal; a first determining module, configured to determine a phase difference between the burst signal and a local sampling clock corresponding to the first sampling frequency according to the second sampling signal; and an interpolation filter, configured to the first sampling signal according to the phase difference to obtain a target sampling signal.

An optical receiver is further provided, including a signal sampling apparatus described in the present disclosure.

DETAILED DESCRIPTION

The present disclosure will be described below with reference to the accompanying drawings and in connection with embodiments. It should be noted that the embodiments of the present disclosure and the features in the embodiments may be combined with each other without conflict.

It should be noted that the terms "first", "second" and the like in the specification and claims of the present disclosure and the accompanying drawings are used to distinguish similar objects without having to be used to describe the specified sequential or chronological order.

Embodiment 1

Figure 1:
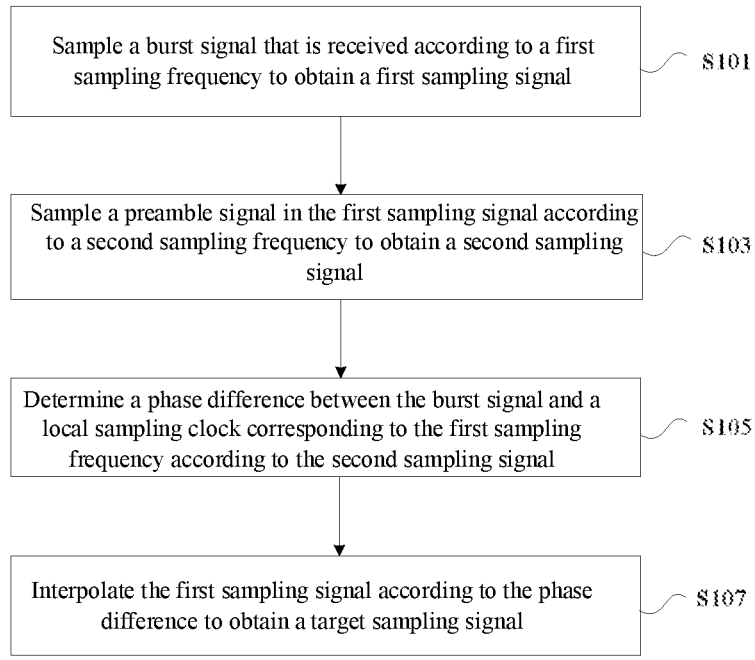
FIG. 1 is a flowchart of a signal sampling method according to an embodiment provided in the present disclosure.

FIG. 1 is a flowchart of a signal sampling method according to an embodiment provided in the present disclosure. As shown in FIG. 1, the flowchart includes the following steps.

In step S101, a received burst signal is sampled according to a first sampling frequency to obtain a first sampling signal.

In step S103, the preamble signal in the first sampling signal is sampled according to a second sampling frequency to obtain a second sampling signal.

In step S105, a phase difference between the burst signal and a local sampling clock corresponding to the first sampling frequency is determined according to the second sampling signal.

In step S107, the first sampling signal is interpolated according to the phase difference to obtain a target sampling signal.

Through the above steps, the received burst signal is sampled according to the first sampling frequency to obtain the first sampling signal, the preamble signal in the first sampling signal is sampled according to the second sampling frequency to obtain the second sampling signal, the phase difference between the burst signal and the local sampling clock corresponding to the first sampling frequency is determined according to the second sampling signal, and the first sampling signal is interpolated according to the phase difference to obtain the target sampling signal. Therefore, the problem of decrease of a signal-to-noise ratio and increase of bit errors caused by sampling phase deviation in the related technology may be solved, so that the effect of reducing the error between the received burst signal and the obtained target sampling signal can be achieved.

In an alternative embodiment, determining the phase difference between the burst signal and the local sampling clock corresponding to the first sampling frequency according to the second sampling signal includes: performing symbol decision on the second sampling signal to obtain a decision signal; determining an error signal of the second sampling signal and the decision signal; and determining the phase difference between the burst signal and the local sampling clock corresponding to the first sampling frequency according to the error signal.

In an alternative embodiment, determining the phase difference between the burst signal and the local sampling clock corresponding to the first sampling frequency according to the error signal includes: determining a result of discrete Fourier transform of the error signal at a symbol frequency corresponding to the burst signal; and determining the phase difference according to the result of the discrete Fourier transform.

In an alternative embodiment, determining the phase difference according to the result of the discrete Fourier transform includes: extracting a sampling phase according to the result of the discrete Fourier transform, and determining the phase difference according to the sampling phase.

In an alternative embodiment, determining the phase difference between the burst signal and the local sampling clock corresponding to the first sampling frequency according to the second sampling signal further includes: cancelling inter-symbol interference of the second sampling signal; and determining the phase difference between the burst signal and the local sampling clock corresponding to the first sampling frequency according to the second sampling signal in which the inter-symbol interference is cancelled.

In an alternative embodiment, interpolating the first sampling signal according to the phase difference to obtain the target sampling signal includes: determining a sample point offset of the first sampling signal according to the phase difference; and interpolating the first sampling signal according to the sample point offset to obtain the target sampling signal.

Figure 2:
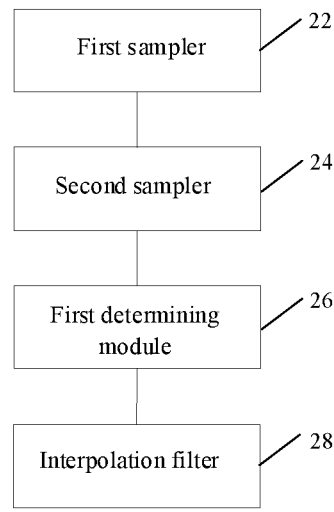
FIG. 2 is a block diagram of a configuration of a signal sampling apparatus according to an embodiment provided in the present disclosure.

According to another embodiment of the present disclosure, a signal sampling apparatus is further provided. FIG. 2 is a block diagram of the signal sampling apparatus according to the embodiment of the present disclosure. As shown in FIG. 2, the apparatus includes a first sampler 22 which is configured to sample a burst signal that is received according to a first sampling frequency to obtain a first sampling signal, a second sampler 24 which is configured to sample a preamble signal in the first sampling signal according to a second sampling frequency to obtain a second sampling signal, a first determining module 26 which is configured to determine a phase difference between the burst signal and a local sampling clock corresponding to the first sampling frequency according to the second sampling signal, and an interpolation filter 28 which is configured to interpolate the first sampling signal according to the phase difference to obtain a target sampling signal.

Through the above modules, the received burst signal is sampled according to the first sampling frequency to obtain the first sampling signal, the preamble signal in the first sampling signal is sampled according to the second sampling frequency to obtain the second sampling signal, the phase difference between the burst signal and the local sampling clock corresponding to the first sampling frequency is determined according to the second sampling signal, and the first sampling signal is interpolated according to the phase difference to obtain the target sampling signal. Therefore, the problem of decrease of a signal-to-noise ratio and increase of bit errors caused by sampling phase deviation in the related technology may be solved, so that the effect of reducing the error between the received burst signal and the obtained target sampling signal can be achieved.

In an alternative embodiment, the first determining module includes a decision unit which is configured to perform symbol decision on the second sampling signal to obtain a decision signal, a first determining unit which is configured to determine an error signal of the second sampling signal and the decision signal, and a second determining unit which is configured to determine the phase difference between the burst signal and the local sampling clock corresponding to the first sampling frequency according to the error signal.

In an alternative embodiment, the second determining unit includes a first determining subunit which is configured to determine a result of discrete Fourier transform of the error signal at a symbol frequency corresponding to the burst signal, and a second determining subunit which is configured to determine the phase difference according to the result of the discrete Fourier transform.

In an alternative embodiment, the second determining subunit is configured to extract a sampling phase according to the result of the discrete Fourier transform, and determining the phase difference according to the sampling phase.

In an alternative embodiment, the first determining module includes a cancellation unit which is configured to cancel inter-symbol interference of the second sampling signal, and a third determining unit which is configured to determine the phase difference between the burst signal and the local sampling clock corresponding to the first sampling frequency according to the second sampling signal in which the inter-symbol interference is cancelled.

In an alternative embodiment, the interpolation filter includes a fourth determining unit which is configured to determine a sample point offset of the first sampling signal according to the phase difference, and a first interpolation unit which is configured to interpolate the first sampling signal according to the sample point offset to obtain the target sampling signal.

The apparatus in this embodiment is used to implement the embodiments and the alternative embodiments described above, and what has already been described will not be repeated herein. As used above, the implementation of the terms "module" and "unit" may achieve a combination of software and/or hardware with respect to a predetermined function.

The plurality of modules may be implemented by software or hardware, and the hardware may be implemented in the following manner, but is not limited herein. That is, the plurality of modules are located in the same processor, or, the plurality of modules are respectively located in different processors in any combination.

According to another embodiment of the present disclosure, an optical receiver is provided, which includes a signal sampling device according to any one of the above.

Alternative Embodiment

The following describes an embodiment of the present disclosure with reference to an application scenario.

A continuous transmission synchronous digital phase-locked loop technology is not suitable for an uplink burst system because the time for setting up a stable loop is too long. A downlink PON transmission system is a continuous transmission receiving system, which has many timing or symbol synchronization algorithms for continuous transmission receiving data, and the reception of uplink burst mode transmission is different from that of continuous system transmission. Since different burst packets usually come from different user terminals ONUs and the transmission requirements are generated in different times, the transmission channels from multiple ONUs to OLTs in the burst mode for multiple burst packets are different and the delay is different, and the synchronization information obtained by one packet is unable to be used for the next packet. Each burst packet typically has a preamble, so capture and phase synchronization of the burst packet is usually data-assisted, and the phase synchronization needs to be established before valid data. The preamble used for the synchronization should not be too long because transmission of the system also needs high efficiency. In addition, lengths of burst packets may be long or short, and some burst packets may have only several thousands, several hundreds or even several tens of symbols. Sometimes the time of sending messages is short, and the synchronization must be realized before the valid data of the burst packets. Therefore, the main difficulty of burst clock recovery lies in the finite preamble, so that the fast estimation and acquisition of the phase need to be realized in the shortest possible time.

In addition to the time for the phase synchronization needs to be as short as possible, jitter of the phase estimation also needs to be as small as possible. Most timing phase detection depends on signal modulation bandwidth, and the timing error is closely related to the noise ratio, thus affecting the jitter of the phase estimation. Generally, the smaller the signal modulation bandwidth and the signal-to-noise ratio, the larger the jitter variance of the phase estimation. For raised cosine modulated signals such as not return to zero (NRZ) signals, the performance of timing phase detection heavily depends on the Nyquist rolloff factor. The smaller the rolloff factor, the smaller the modulation bandwidth, the larger the variance of the phase estimation and the worse the synchronization performance. And the rolloff factor affects spectral efficiency. The smaller the rolloff factor, the higher the spectral efficiency. In practical engineering, based on the spectral efficiency, the rolloff factor is generally in a range of 0.15 to 0.5. Therefore, the uplink burst clock recovery of PON requires that the jitter of the phase estimation and timing recovery is as small as possible when the modulation bandwidth and signal-to-noise ratio are small, thereby recovering the best position of data sampling better.

In an alternative embodiment of the present disclosure, a fast phase estimation method and a timing recovery apparatus are provided for burst clock recovery in high-speed optical network transmission based on the phase and clock recovery requirements of the PON uplink burst receiving system. This method is insensitive to the Nyquist rolloff factor. In the case of low signal-to-noise ratio and small rolloff factor, the jitter of the phase estimation in this method is much smaller than that of the phase estimated by other general algorithms such as square law (SL). The optimal sampling position of the recovered data is more accurate, the hardware implementation is simple, and the phase may be acquired and the timing synchronization may be set up quickly in the preamble before the valid data of the burst packet.

In an alternative embodiment of the present disclosure, clock and data recovery (CDR) is divided into two stages, i.e., phase estimation and data interpolation. When phase estimation is performed using the preamble of the burst packet, the data of the burst packet needs to be cached. The clock recovery apparatus for uplink burst reception on the OLT side of the TDM PON system in the present disclosure includes three main functional modules, i.e, filtering, phase estimation and interpolation filtering. To estimate phase error correction and jitter tracking, the interpolation filter may be replaced with a CDR, such as a feedback loop Gardner phase detection CDR with better tracking performance.

After an receiver on the OLT side detects the arrival of the burst packet, the ADC samples the received signal at a local fixed clock frequency to obtain a sampling sequence x(n) of a burst packet signal. The sampling satisfies $T_s=T/2$, i.e., 2-times sampling, T is a symbol period, and $T_s$ is a sampling period of the local sampling clock of the ADC on the OLT side. A clock frequency of the OLT side adopted in this solution is synchronized with that of the remote ONU transmitting symbol. For the TDM PON system in which the communication between the OLT and the remote ONU node is continuous, a local oscillator of the remote ONU is locked to a clock (which is high precision) of the OLT by using a phase locked loop (PLL), so that a frequency of burst transmission from the remote ONU to the central office OLT may be ensured to be synchronized with a frequency of the clock on the OLT side.

A partial sequence of the digital signal of the burst packet sampled by ADCs is 2-times up-sampled, and is then sent to an equalization filter for equalization to eliminate intersymbol interference (ISI). This portion of the digital signal is sampling data corresponding to a known preamble of the burst packet consisting of N (which may be tens to thousands) symbols.

The phase estimation module receives a digital signal of the preamble output after equalization by the equalization filter, and the digital signal of the preamble is a 4-times sampling signal y(k)(k=0, 1, ..., 4N−1).

Then, the decision is performed on y(k) and a corresponding decision sequence a(k)(k=0, 1, ..., 4N−1) is obtained.

A sampling error signal y(k)−a(k), k=0, 1, ..., 4N−1 caused by the sampling phase and signal phase offset is obtained from the sampling signal y(k) and a corresponding decision sequence a(k) of the sampling signal y(k), and then an absolute value sequence |y(k)−a(k)|, k=0, 1, ..., 4N−1 of the sampling error signal, which may also be a square sequence [y(k)−a(k)]², k=0, 1, ..., 4N−1 of the sampling error signal, is further obtained.

Discrete Fourier transform (DFT) at a symbol frequency 1/T is calculated with respect to the absolute value sequence |y(k)−a(k)|, k=0, 1, ..., 4N−1, that is:

$$Y = \sum_{k=0}^{4N-1} |y(k) - a(k)| e^{-j\frac{\pi}{2}k}$$

A sampling phase offset τ is obtained by extracting the sampling phase according to the discrete Fourier transform Y at 1/T, that is:

$$\tau = \frac{T}{2\pi} \arg(Y)$$

Here, arg( ) represents computation of an argument of a complex number. The phase is estimated to be τ∈(−T/2, T/2].

The sampling phase offset τ is normalized by the sampling period $T_s$ and then converted to a sampling point offset under 2-times sampling, that is:

$$\mu = \frac{\tau}{T_s} = \frac{\tau}{T/2} = \frac{1}{\pi}\arg(Y)$$

The estimated sampling point offset μ is sent to the interpolation filter. An interpolator of the interpolation filter is implemented with Farrow structure. The μ is sent into an interpolation position register of a Farrow interpolator. In this way, the interpolator interpolates the 2-times sampling signal of the burst packet to recover the best sampling data whose sampling phase coincides with the phase of the burst signal.

Figure 3:
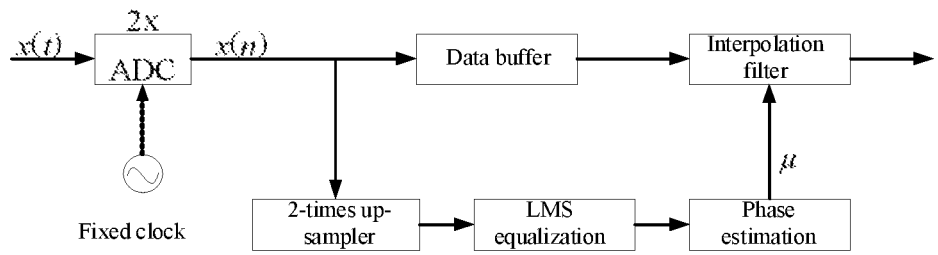
FIG. 3 is a block diagram of implementation of a burst clock recovery scheme according to an embodiment provided in the present disclosure.

In an alternative embodiment, FIG. 3 is a block diagram of implementation of a burst clock recovery scheme according to an embodiment provided in the present disclosure, as shown in FIG. 3, which mainly includes five portions, i.e., a 2-times up-sampler, an equalization filter, a phase estimation module, a data buffer and an interpolation filter.

The implementation of this method is shown in FIG. 3. The optical receiver on the OLT side receives an analog signal x(t) of the burst packet, and the ADC performs the 2-times sampling on the burst packet signal based on a local clock period $T_s$=T/2 to obtain a sampling sequence. A preamble sequence of the sequence x(n) is sent to a 2-times up-sampling module for sampling, a sampled 4-times sampling preamble sequence is sent to a least mean square (LMS) equalizer for equalization so as to eliminate inter-symbol interference (ISI) and then sent to a phase estimation module for estimating a phase difference between the burst signal and the local sampling clock to obtain a normalized phase offset τ. Due to the delay of the phase estimation, the data during this period is cached in the data buffer. The sampling point offset μ obtained after the estimation is sent to the interpolation filtering module. The interpolator of the interpolation filtering module is implemented with Farrow structure. The μ is sent into an interpolation position register of a Farrow interpolator. In this way, the interpolator interpolates the 2-times sampling data signal of the burst packet in the buffer in order to recover the best sampling data whose sampling phase coincides with the phase of the burst signal.

Figure 4:
FIG. 4 is a flow chart of a phase estimation algorithm of an error signal according to an embodiment provided in the present disclosure.
Figure 5:
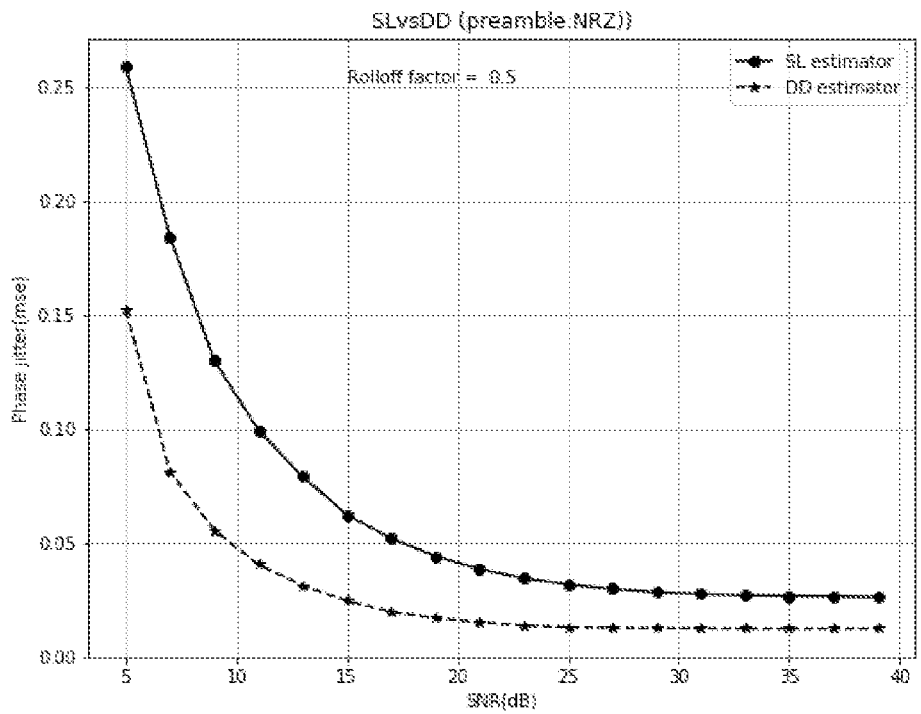
FIG. 5 is a performance diagram of a phase estimation method with respect to a rolloff factor according to an alternative embodiment provided in the present disclosure.
Figure 6:
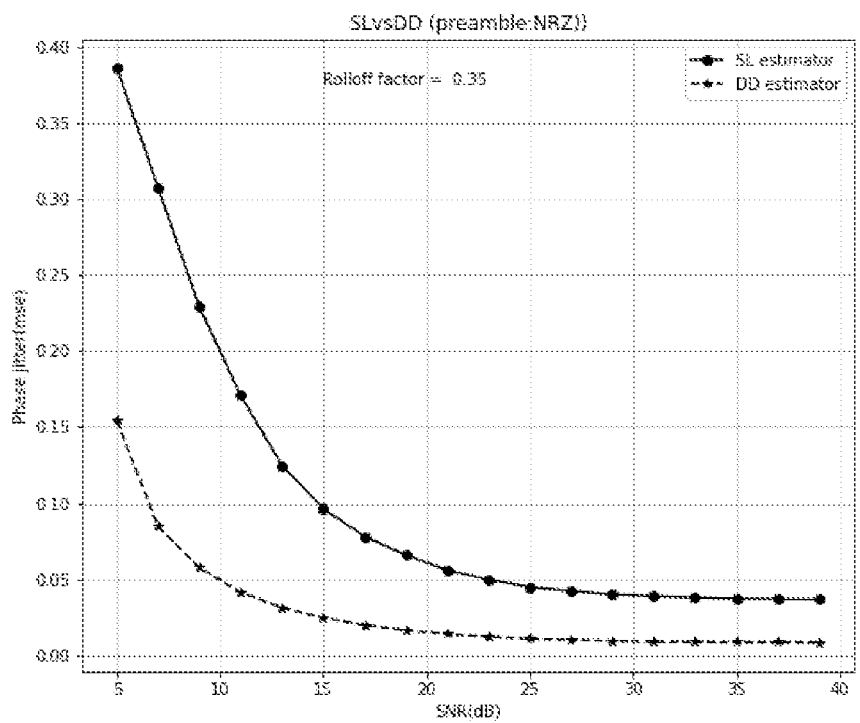
FIG. 6 is another performance diagram of a phase estimation method with respect to a rolloff factor according to an alternative embodiment provided in the present disclosure.
Figure 7:
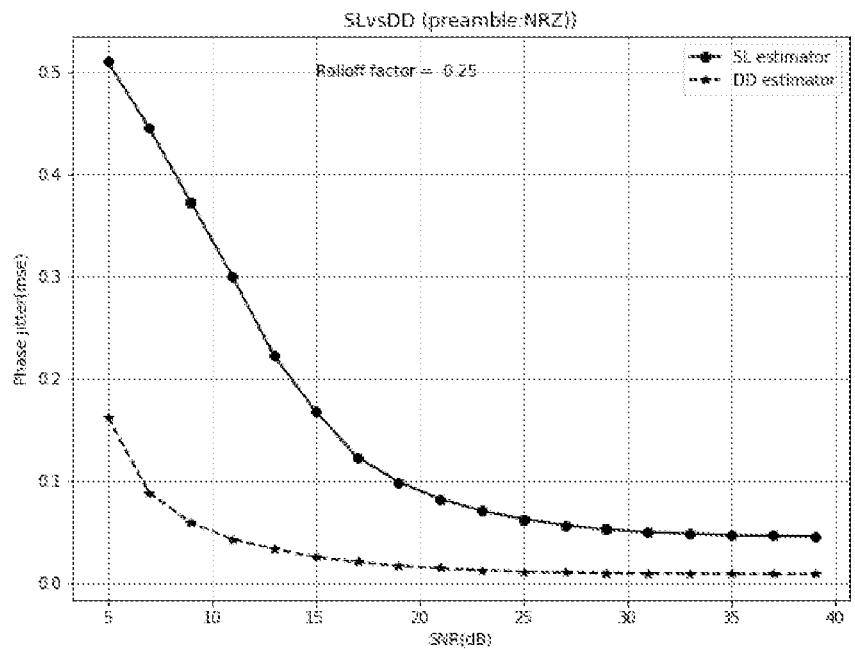
FIG. 7 is still another performance diagram of a phase estimation method with respect to a rolloff factor according to an alternative embodiment provided in the present disclosure.
Figure 8:
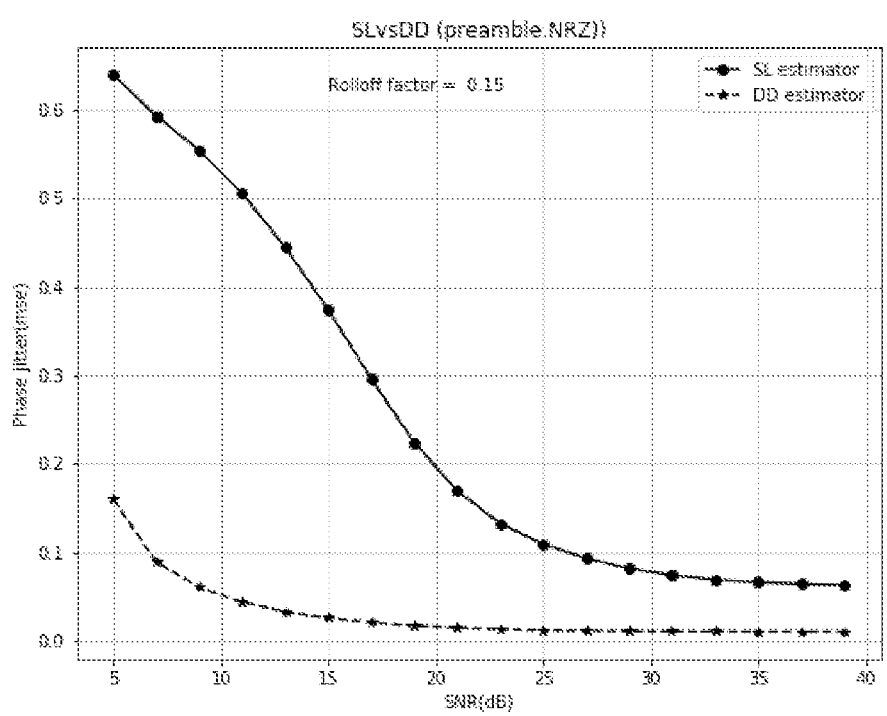
FIG. 8 is yet another performance diagram of a phase estimation method with respect to a rolloff factor according to an alternative embodiment provided in the present disclosure.

The implementation of the phase estimation module of the present disclosure is shown in FIG. 4, which is a flow diagram of a phase estimation algorithm of an error signal according to an embodiment provided in the present disclosure. In terms of resources for the implementation, the ADC on the OLT side only needs to perform the 2-times sampling on the burst signal to obtain a 2-times sampling digital signal of the burst signal, and the preamble of the burst packet is a 160 binary modulated {−1, +1} NRZ signal, and a 2-times sampling signal sequence corresponding to the preamble of the burst packet is x(n)(n=0, 1, ..., 319).

The 2-times sampling sequence of the preamble x(n) is sent to the 2-times up-sampler for the 2-times up-sampling to obtain a 4-times sampling sequence y(k)(k=0, 1, ..., 639).

y(k)(k=0, 1, ..., 639 is sent to the equalization filter for the LMS equalization to eliminate ISI and then sent to the phase estimation module.

An implementation of estimating a phase offset using an error signal caused by a symbol sampling phase offset is shown in FIG. 4. A symbol decision sub-module of the phase estimation module performs symbol decision on y(k), k=0, 1, ..., 639 first to obtain a corresponding decision sequence a(k)=sign(y(k)), k=0, 1, ..., 639.

An error signal submodule calculates the error signal caused by the sampling phase offset of the ADC, that is, e(k)=|y(k)−a(k)|, k=0, 1, ..., 639.

A discrete Fourier submodule calculates the Fourier transform at a frequency 1/T with respect to the error signal sequence e(k), that is:

$$Y = \sum_{k=0}^{639} e(k) e^{-j\frac{\pi}{2}k}$$

In an embodiment, Y=A+jB, $$A = \sum_{i=0}^{159} [e(4i) - e(4i+2)], \text{ and } B = \sum_{i=0}^{159} [e(4i+3) - e(4i-1)].$$

A phase extraction submodule calculates a normalized sampling phase offset μ, $$\mu = \frac{1}{\pi}\arg(Y).$$

There is certain delay in the 2-times up-sampling, equalization filtering and phase estimation. In this process, the burst digital signal needs to be buffered and the optimal sampling position is recovered after the normalized sampling phase offset µ is estimated.

The normalized sampling phase offset µ is sent to the interpolation filter. The interpolator of the interpolation filter is implemented with a polynomial interpolation filter of 4 or 6-tap Farrow structure. The µ is sent to an interpolation fractional interval register of the Farrow interpolator. In this way, the interpolator interpolates the 2-times sampling signal of the burst packet from the buffered data, thereby recovering the best sampling data whose sampling phase coincides with the phase of the burst signal.

In the case of low signal-to-noise ratio and small rolloff factor, the phase jitter in the burst clock phase estimation method in the present disclosure is much smaller than that in other general phase estimation methods such as square law (SL), and the optimal sampling position of the recovered data is more accurate. FIGS. 5 to 8 illustrate the performance of the phase jitter estimated by the square law SL estimation algorithm and the phase estimation algorithm in the present disclosure in the case of rolloff factors R=0.5, R=0.35, R=0.25 and R=0.15, respectively, where SL estimator is a square law phase estimator and a decision-directed (DD) estimator is the phase estimator of the present disclosure.

With the description of the above embodiments, those skilled in the art may appreciate that the method according to the above embodiments may be implemented by software plus a necessary general hardware platform, or by hardware. The present disclosure may be embodied in a form of a software product that is stored in a storage medium, such as a read-only memory (ROM) or a random access memory (RAM), a magnetic disk, an optical disc, or the like. The storage medium includes a plurality of instructions to cause a terminal device, which may be a mobile phone, a computer, a server, a network device, or the like, to perform the method described in any of the embodiments provided in the present disclosure.

It should be understood by those skilled in the art that the plurality of modules or steps of the present disclosure described above may be implemented by general computing devices, which may be centralized on a single computing device, or distributed over a network composed of a plurality of computing devices. Alternatively, these modules or steps may be implemented by program code executable by the computing device, which thus may be stored in a storage device and executed by the computing device. In some cases, the steps may be implemented in a sequence different from that shown or described herein, the modules may be separately fabricated into a plurality of integrated circuit modules, or some of the plurality of modules or steps may be fabricated into a single integrated circuit module. The present disclosure is not limited to any specified combination of hardware and software.

What is claimed is:

1. A signal sampling method, comprising:
   sampling a burst signal according to a first sampling frequency to obtain a first sampling signal;
   sampling a preamble signal in the first sampling signal according to a second sampling frequency to obtain a second sampling signal;
   determining a phase difference between the burst signal and a local sampling clock corresponding to the first sampling frequency according to the second sampling signal; and
   interpolating the first sampling signal according to the phase difference to obtain a target sampling signal;
   wherein determining the phase difference between the burst signal and the local sampling clock corresponding to the first sampling frequency according to the second sampling signal comprises:
   performing symbol decision on the second sampling signal to obtain a decision signal;
   determining an error signal of the second sampling signal and the decision signal; and
   determining the phase difference between the burst signal and the local sampling clock corresponding to the first sampling frequency according to the error signal.

2. The method according to claim 1, wherein determining the phase difference between the burst signal and the local sampling clock corresponding to the first sampling frequency according to the error signal comprises:
   determining a result of discrete Fourier transform of the error signal at a symbol frequency corresponding to the burst signal; and
   determining the phase difference according to the result of the discrete Fourier transform.

3. The method according to claim 2, wherein determining the phase difference according to the result of the discrete Fourier transform comprises:
   extracting a sampling phase according to the result of the discrete Fourier transform, and determining the phase difference according to the sampling phase.

4. The method according to claim 1, wherein determining the phase difference between the burst signal and the local sampling clock corresponding to the first sampling frequency according to the second sampling signal comprises:
   cancelling inter-symbol interference of the second sampling signal; and
   determining the phase difference between the burst signal and the local sampling clock corresponding to the first sampling frequency according to the second sampling signal in which the inter-symbol interference is cancelled.

5. The method according to claim 1, wherein interpolating the first sampling signal according to the phase difference to obtain the target sampling signal comprises:
   determining a sample point offset of the first sampling signal according to the phase difference; and
   interpolating the first sampling signal according to the sample point offset to obtain the target sampling signal.

6. An optical line terminal, comprising:
   a receiver, configured to receive and sample a burst signal according to a first sampling frequency to obtain a first sampling signal;
   a 2-times up-sampler coupled to the receiver, configured to sample a preamble signal in the first sampling signal according to a second sampling frequency to obtain a second sampling signal; and
   an interpolation filter, configured to interpolate the first sampling signal according to a phase difference to obtain a target sampling signal, wherein the phase difference is between the burst signal and a local sampling clock corresponding to the first sampling frequency and is determined according to the second sampling signal;
   wherein the optical line terminal further comprises a processor configured to:
   perform symbol decision on the second sampling signal to obtain a decision signal;
   determine an error signal of the second sampling signal and the decision signal; and determine the phase difference between the burst signal and the local sampling clock corresponding to the first sampling frequency according to the error signal.

7. The optical line terminal according to claim 6, wherein the processor is further configured to:
determine a result of discrete Fourier transform of the error signal at a symbol frequency corresponding to the burst signal; and
determine the phase difference according to the result of the discrete Fourier transform.

8. The optical line terminal according to claim 7, wherein the processor is configured to extract a sampling phase according to the result of the discrete Fourier transform, and determining the phase difference according to the sampling phase.

9. The optical line terminal according to claim 6, wherein the optical line terminal further comprises an equalization filter configured to:
cancel inter-symbol interference of the second sampling signal;
wherein the phase difference between the burst signal and the local sampling clock corresponding to the first sampling frequency is determined according to the second sampling signal in which the inter-symbol interference is cancelled.

10. The optical line terminal according to claim 6, wherein the interpolation filter is further configured to:
determine a sample point offset of the first sampling signal according to the phase difference; and
interpolate the first sampling signal according to the sample point offset to obtain the target sampling signal.

\* \* \* \* \*